(12) United States Patent
Sato et al.

(10) Patent No.: US 9,511,438 B2
(45) Date of Patent: Dec. 6, 2016

(54) SOLDER BUMP FORMING METHOD AND APPARATUS

(71) Applicant: SENJU METAL INDUSTRY CO., LTD., Tokyo (JP)

(72) Inventors: Issaku Sato; Akira Takaguchi, Toyama (JP); Isamu Sato, Tokyo (JP); Takashi Nauchi, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 152 days.

(21) Appl. No.: 14/352,507

(22) PCT Filed: Oct. 18, 2012

(86) PCT No.: PCT/JP2012/076889
§ 371 (c)(1),
(2) Date: Jul. 17, 2014

(87) PCT Pub. No.: WO2013/058299
PCT Pub. Date: Apr. 25, 2013

(65) Prior Publication Data
US 2015/0007958 A1 Jan. 8, 2015

(30) Foreign Application Priority Data

Oct. 18, 2011 (JP) .................. 2011-229206

(51) Int. Cl.
*B23K 3/06* (2006.01)
*H01L 21/44* (2006.01)
(Continued)

(52) U.S. Cl.
CPC ............. *B23K 1/20* (2013.01); *B22D 17/2023* (2013.01); *B23K 3/0623* (2013.01);
(Continued)

(58) Field of Classification Search
CPC ....................................................... B23K 3/085
See application file for complete search history.

(56) References Cited

U.S. PATENT DOCUMENTS 5,244,143 A * 9/1993 Ference ................... B23K 1/20
228/180.21
6,827,789 B2 * 12/2004 Lee ..................... H01L 21/6719
118/719
(Continued)

FOREIGN PATENT DOCUMENTS

| JP | S54-082341 | 6/1979 |
| JP | H2-015698 | 1/1990 |
| JP | H11-040937 | 2/1999 |
| JP | 11-345816 A | 12/1999 |
| JP | 2003-133359 A | 9/2003 |
| WO | WO 2009/082062 A1 | 7/2009 |

OTHER PUBLICATIONS

Extended European Search Report dated Apr. 17, 2015 in corresponding application No. EP 12841013.
(Continued)

*Primary Examiner* — Devang R Patel
(74) *Attorney, Agent, or Firm* — Harness, Dickey & Pierce, PLC

(57) ABSTRACT

Provided is a solder bump forming method that enables micro-solder bumps to be formed without the possibility of occurrence of a bridge due to excess molten solder. An injection head 11 for supplying molten solder has a nozzle 16 brought into contact with a mask with openings that is disposed over a substrate 8. After completing a supply operation, the injection head 11 is forcedly cooled by heat transfer from a cooling unit 13 through a heater unit 12 whose operation has been stopped. Molten solder 15 in the cooled injection head 11 does not drool from the nozzle 16 when the injection head 11 moves up.

4 Claims, 6 Drawing Sheets

(51) Int. Cl.
    *B23K 1/20* (2006.01)
    *H01L 23/00* (2006.01)
    *B22D 17/20* (2006.01)
    *B23K 3/08* (2006.01)
    *H05K 3/34* (2006.01)

(52) U.S. Cl.
    CPC ............ *B23K 3/0638* (2013.01); *B23K 3/085* (2013.01); *H01L 24/11* (2013.01); *H01L 24/741* (2013.01); *H01L 2224/1132* (2013.01); *H01L 2224/11312* (2013.01); *H01L 2224/11848* (2013.01); *H01L 2224/742* (2013.01); *H05K 3/3468* (2013.01)

(56) References Cited

U.S. PATENT DOCUMENTS

| 7,732,320 | B2* | 6/2010 | Johnson | H01L 24/11 257/779 |
| 2008/0188072 | A1* | 8/2008 | Johnson | H01L 24/11 438/615 |

OTHER PUBLICATIONS

International Search Report dated Nov. 27, 2012 from related PCT application JP2012/076889.

* cited by examiner

SOLDER BUMP FORMING METHOD AND APPARATUS

TECHNICAL FIELD

The present invention relates to a method of and apparatus for forming solder bumps on components such as substrates and electronic parts.

BACKGROUND ART

Substrates and electronic parts formed of ceramics or the like cannot be soldered directly. Therefore, the surface of a substrate or an electronic part is provided with pads formed of a plated film, and solder bumps (lumps) are formed on the pads. Thereafter, soldering is performed through the bumps.

Many conventional solder bump forming methods use solder paste. A plated film on an electronic part is coated with solder paste by a printer or a dispenser, and thereafter, the solder paste is melted by reflow heating to form bumps. Similarly, bumps can also be formed on a substrate. This method is low in cost, but cannot form bumps suitable for fine circuit patterns.

There is also a bump forming method utilizing solder balls. Micro-solder balls are mounted on pads of an electronic part or a substrate and then subjected to reflow heating to form bumps. This method can form bumps suitable for fine circuit patterns. However, solder balls themselves are costly; therefore, the overall cost becomes high.

Attention has been paid to the use of the IMS (Injection Molded Solder) method as a method of forming bumps suitable for fine circuit patterns at reduced cost. With the IMS method, a necessary amount of molten solder is dropped onto a device in a non-oxidizing atmosphere from a nozzle opening of a container holding molten solder therein (Japanese Patent Laid-Open Publication No. Sho 54-82341).

There has also been known a solder application apparatus allowing molten solder to be efficiently supplied to a plurality of points by scanning over a substrate in a horizontal direction (Japanese Patent Application No. Hei 2-015698).

There has also been known an apparatus in which a nozzle head formed of a pliable material is provided with a slit to be used as a nozzle, and molten solder in the nozzle head is discharged from the nozzle by applying a controlled pressure of an inert gas to the molten solder in the nozzle head, thereby supplying a necessary amount of molten solder through openings of a mask having an opening pattern corresponding to a conductor pattern (Japanese Patent Laid-Open Publication No. Hei 11-040937).

CITATION LIST

Patent Document

Patent Document 1: Japanese Patent Laid-Open Publication No. Sho 54-082341
Patent Document 2: Japanese Patent Laid-Open Publication No. Hei 2-015698
Patent Document 3: Japanese Patent Laid-Open Publication No. Hei 11-040937

SUMMARY OF INVENTION

Technical Problem

In the solder bump formation using the IMS method, bumps are formed on the mounting surface of an electronic part or a substrate; therefore, it is difficult to control the amount of molten solder to be supplied. In addition, there is a possibility of surplus molten solder forming an unfavorable bridge.

In the apparatus disclosed in Patent Document 1, the amount of molten solder to be dropped is controlled by the variation of the gap between the nozzle opening and the tapered distal end of a rod (stopper) passing through the nozzle opening. With such a control method, however, it is difficult to repeatedly supply a fixed amount of molten solder. It is also difficult to supply a very small amount of molten solder.

In the apparatus disclosed in Patent Document 2, an excess amount of molten solder supplied onto the substrate is cut into a predetermined amount of molten solder by using a blade. Therefore, it is also difficult with this apparatus to supply a very small amount of molten solder. In addition, the apparatus has no scheme to dispose of surplus molten solder having been discharged from a large supply opening after the molten solder supply operation.

In the apparatus disclosed in Patent Document 3, molten solder is filled into each opening of the mask to thereby enable a very small amount of molten solder to be supplied onto the substrate. However, no measures are taken to dispose of surplus molten solder. That is, when the nozzle head is lifted up from the mask after the operation, molten solder having already been discharged from the slit nozzle is likely to be scattered by being lifted up at the same time as the nozzle head. There is also a possibility that the molten solder in the nozzle head may newly leak out by being pulled by the already discharged molten solder. Further, a gap may be generated between the mask and the substrate by the force applied to the nozzle head when lifted up from the mask, and unsolidified molten solder may flow into the gap. In either case, there is a possibility of occurrence of an unfavorable bridge.

Accordingly, an object of the present invention is to provide a solder bump forming method and apparatus capable of forming micro-solder bumps and free from the occurrence of a bridge due to excess molten solder.

Solution to Problem

The present invention provides a solder bump forming method. This method includes: loading, onto a work stage, a component to be formed with a solder bump on an upper surface thereof, a mask being disposed over the upper surface of the component, the mask having an opening at a position corresponding to a position where the bump is to be formed; preheating the component with a first heater unit; lowering an injection head into contact with an upper surface of the mask disposed over the component, the injection head being configured to hold molten solder therein and supply the molten solder from a nozzle at a bottom thereof; bringing an upper surface of a second heater unit and a lower surface of the component into contact with each other to heat the component, which has already been preheated, to a working temperature thereof; heating the solder in the injection head to a working temperature thereof with a third heater unit; allowing the injection head to slide over the mask while discharging the molten solder heated to the working temperature from the nozzle to flow into the opening in the mask and scraping surplus molten solder off the upper surface of the mask, thereby filling the molten solder into the opening in the mask, and thus supplying a predetermined amount of molten solder onto the component; stopping respective operations of the second heater unit and the third heater unit after completion of the supply of molten solder by the injection head; bringing an upper surface of a first cooling unit into contact with a lower surface of the second heater unit, whose operation has already been stopped, to forcedly cool the injection head by heat transfer from the first cooling unit through the second heater unit, the component, and the mask, thereby lowering a temperature of the molten solder in the injection head to a temperature at which the molten solder does not drool from the nozzle; raising the injection head to separate from the mask after the temperature of the molten solder in the injection head has lowered to the temperature at which the molten solder does not drool from the nozzle; forcedly cooling and solidifying the molten solder supplied onto the component with a second cooling unit to form a bump; and unloading the component having the bump formed on the upper surface from the work stage.

The above-described solder bump forming method may be as follows. The work stage is cyclically movable between first to fourth index positions. The loading the component onto the work stage is carried out at the first index position. The preheating the component is carried out at the second index position. The bringing the injection head into contact with the upper surface of the mask, the heating the component to the working temperature thereof, the heating the solder in the injection head to the working temperature thereof, the supplying the molten solder in the injection head onto the component, the stopping the respective operations of the second heater unit and the third heater unit, the cooling the injection head to lower the temperature of the molten solder in the injection head, and the raising the injection head to separate from the mask are carried out at the third index position. The cooling and solidifying the molten solder on the component to form a bump is carried out at the fourth index position. The unloading the component having the bump formed on the upper surface from the work stage is carried out at the first index position.

In the above-described solder bump forming method, the mask may be a sheet member made of a metal or a resin, or may be a resist film.

In the above-described solder bump forming method, the cooling the injection head to lower the temperature of the molten solder in the injection head may include spraying an inert gas over the injection head.

In addition, the present invention provides a solder bump forming apparatus. This apparatus includes: a work stage for placing thereon a component to be formed with a solder bump on an upper surface thereof, a mask being disposed over the upper surface of the component, the mask having an opening at a position corresponding to a position where the bump is to be formed; a heater unit for heating the component in direct or indirect contact with a lower surface of the component; an injection head configured to hold molten solder therein and having a nozzle at a bottom thereof, the injection head being configured to move horizontally, with the nozzle kept in contact with an upper surface of the mask over the component, thereby filling molten solder discharged from the nozzle into the opening in the mask, and thus supplying a predetermined amount of molten solder onto the component; and a first cooling unit configured to selectively contact a lower surface of the heater unit, the first cooling unit being configured to forcedly cool the injection head through the heater unit, the component supplied with the molten solder, and the mask when the first cooling unit contacts the lower surface of the heater unit after the operation thereof has been stopped.

The heater unit may include a first heater unit for preheating the component in direct or indirect contact with the lower surface of the component, and a second heater unit for further heating the component to the working temperature in direct or indirect contact with the lower surface of the component in place of the first heater unit. In this case, the first cooling unit forcedly cools, when contacting a lower surface of the second heater unit after an operation of the second heater unit has been stopped, the injection head through the second heater unit, the component supplied with the molten solder, and the mask. In addition, the solder bump forming apparatus may further have a second cooling unit capable of further forcedly cooling the component supplied with the molten solder in direct or indirect contact with the lower surface of the component in place of the second heater unit and the first cooling unit.

In addition, the solder bump forming apparatus may further have a work stage moving device. In this case, the work stage may include first to fourth work stages supported by the work stage moving device. The first to fourth work stages are spaced from each other at an angle of 90 degrees around an axis of rotation of the work stage moving device. The work stage moving device is configured to intermittently rotate the first to fourth work stages so that the first to fourth work stages take fixed first to fourth index positions, respectively, in sequential rotation.

In addition, the solder bump forming apparatus may further include a supply stage for loading and unloading the component between the supply stage and the work stage positioned at the first index position. The first heater unit may be disposed at the second index position. The second heater unit, the injection head, and the first cooling unit may be disposed at the third index position. The second cooling unit may be disposed at the fourth index position.

Advantageous Effects of Invention

According to the solder bump forming method and apparatus of the present invention, a mask having an opening at a position corresponding to a position where a bump is to be formed is disposed over an upper surface of a component which is one of a substrate and an electronic part, and molten solder is filled into the opening provided in the mask. With this method, it becomes possible to form a micro-solder bump on the component.

Further, after molten solder has been supplied onto the component, the injection head kept in contact with the mask over the component is forcedly cooled with a cooling unit, thereby making it possible to prevent drooling of molten solder from the injection head when the injection head is raised. Further, during the forced cooling process, the molten solder supplied onto the component is also forcedly cooled naturally. Therefore, there is extremely little possibility that the molten solder supplied onto the component may form a bridge.

BRIEF DESCRIPTION OF DRAWINGS

FIG. 4(*b*) is a side view showing the work stage moving device in the position shown in FIG. 4(*a*), together with a first heater unit, as seen from the second index position side.

FIG. 5(*b*) is a side view showing the work stage moving device in the position shown in FIG. 5(*a*), together with an injection head, a second heater unit, and a first cooling unit, as seen from the second index position side.

FIG. 6(*b*) is a side view showing the work stage moving device in the position shown in FIG. 6(*a*), together with a second cooling unit, as seen from the third index position side.

DESCRIPTION OF EMBODIMENTS

Figure 1:
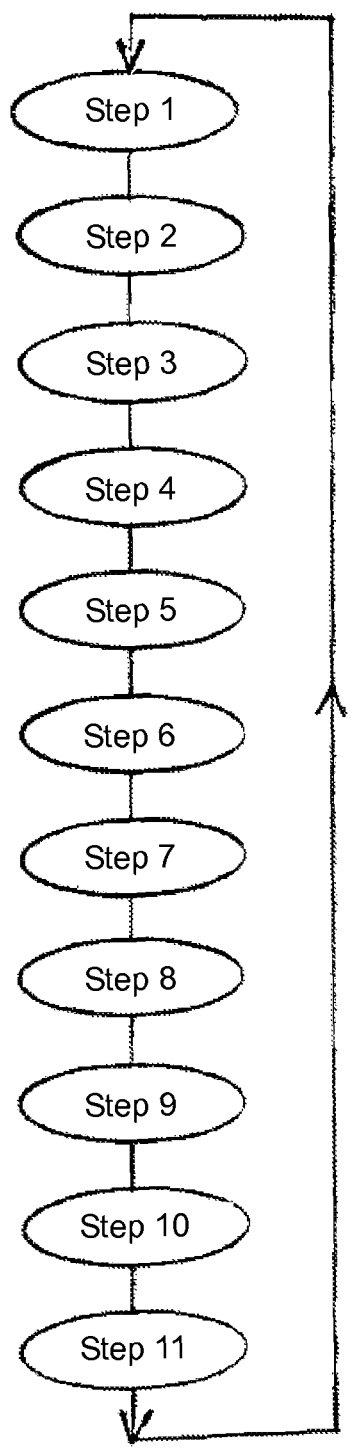
FIG. 1 is a block diagram showing each step of a solder bump forming method according to the present invention.

FIG. 1 is a block diagram showing each step of a solder bump forming method according to the present invention. At step 1, a component is loaded onto a work stage. The component is, typically, a substrate, an electronic part, or the like which is to be formed with a solder bump on an upper surface thereof. The component may include a support member (jig) such as a plate or frame for supporting a substrate, an electronic part, or the like. The support member may support a plurality of substrates or electronic parts. The substrate and the electronic part may have electrically conductive pads at positions where solder bumps are to be formed. A mask is disposed over the upper surface of the component. The mask has an opening at a position corresponding to a position where a solder bump is to be formed. The mask may be a sheet member made of a metal or a resin, or may be a resist film.

At step 2, the component is preheated. When lead-free solder having a melting point of 220° C. is used, for example, the component is preheated to 190° C.

At step 3, an injection head holding solder therein moves down, and a nozzle of the injection head contacts the surface of the mask. The solder in the injection head has already been heated to a standby temperature (e.g. 190° C.).

At step 4, the component is heated to a working temperature. When lead-free solder having a melting point of 220° C. is used, for example, the component is heated to 230° C.

At step 5, the solder in the injection head is heated to the working temperature (e.g. 230° C.). The heated molten solder in the injection head has a viscosity at which the molten solder can be discharged from the nozzle by receiving a predetermined pressure.

At step 6, the injection head having the nozzle brought into contact with the mask over the component slides horizontally over the mask while discharging molten solder from the nozzle. The discharge of the molten solder from the nozzle may be performed by applying a pressurized inert gas such as nitrogen gas to the molten solder in the injection head. The molten solder discharged from the nozzle flows into the opening provided in the mask. Meanwhile, surplus molten solder on the mask is scraped off by the injection head moving horizontally. By these actions, a predetermined amount of molten solder is filled into the opening in the mask. In this way, molten solder is supplied onto the component.

At step 7, the supply of discharge pressure applied to the molten solder in the injection head is stopped, and the supply of molten solder is also stopped. Thereafter, the respective operations of a heater heating the substrate and a heater heating the injection head are stopped.

At step 8, the injection head is forcedly cooled. The forced cooling is performed by using a cooling unit through the component-heating heater (whose operation has already been stopped), the component, and the mask. Further, the forced cooling may be assisted by spraying an inert gas such as nitrogen gas over the injection head. The forced cooling is performed until the molten solder in the injection head cools down to a temperature at which the molten solder does not drool from the nozzle. The temperature necessary for preventing drooling may differ according to the degree of opening and configuration of the nozzle. Because the forced cooling of the injection nozzle is performed through the component, the solder for bump formation that has been supplied onto the component is also cooled.

At step 9, the forcedly cooled injection head is raised and thus separated from the mask. At this time, the temperature of the molten solder in the injection head has already lowered sufficiently; therefore, the molten solder does not drool from the nozzle. In addition, the solder on the component does not form an unfavorable bridge.

At step 10, the molten solder supplied onto the component is forcedly cooled and thus promoted to solidify into a solder bump.

At step 11, the component having the bump formed thereon is unloaded from the work stage.

The above-described solder bump forming method can be carried out in a solder bump forming apparatus according to the present invention in which the work stage cyclically moves between first to fourth index positions. In one embodiment of such a solder bump forming apparatus, for example, the above-described steps 1 to 11 may be carried out at the first to fourth index positions as follows: the step 1 is carried out at the first index position; the step 2 is carried out at the second index position; the steps 3 to 9 are carried out at the third index position; the step 10 is carried out at the fourth index position; and the step 11 is carried out at the first index position. The following is an explanation of one embodiment of the solder bump forming apparatus according to the present invention.

Figure 2A:
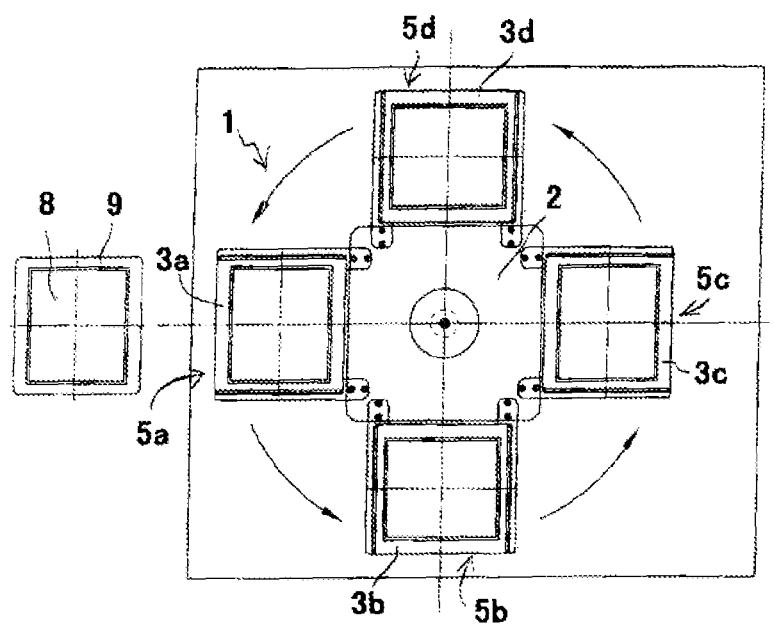
FIG. 2(a) is a top view of a work stage moving device in one embodiment of a solder bump forming apparatus according to the present invention.
Figure 2B:
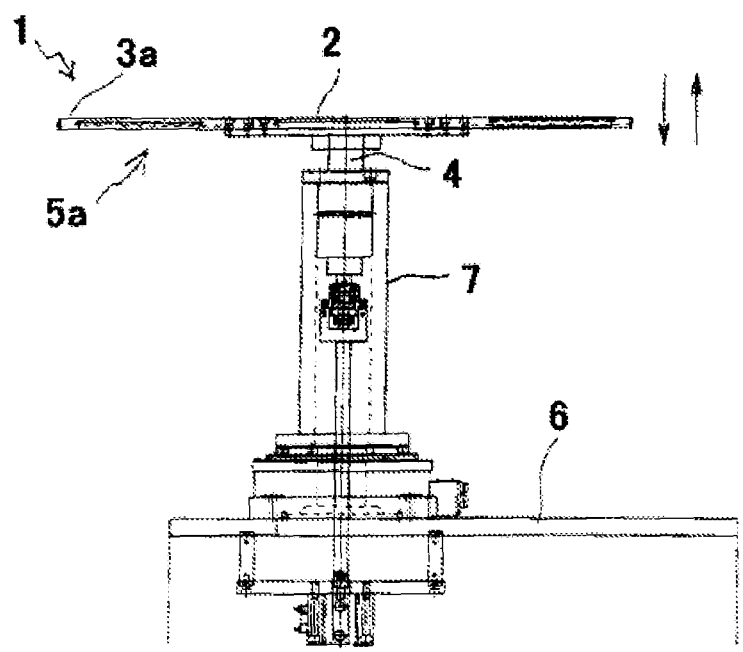
FIG. 2(b) is a side view of the work stage moving device as seen from the second index position side.

FIG. 2(*a*) is a top view of a work stage moving device 1 in the solder bump forming apparatus, and FIG. 2(*b*) is a side view of the work stage moving device 1. The device 1 has four work stages 3*a* to 3*d* secured to a central support plate 2. The central support plate 2 is supported by a shaft 4 rotatably and vertically movably. The work stages 3*a* to 3*d* cyclically move counterclockwise as seen in FIG. 2 so as to sequentially take fixed first to fourth index positions 5*a* to 5*d*, respectively. A post member 7 is disposed on a base 6 to house the shaft 4. The post member 7 incorporates therein a mechanism for rotating the shaft 4 and a mechanism for vertically moving the shaft 4.

Figure 3:
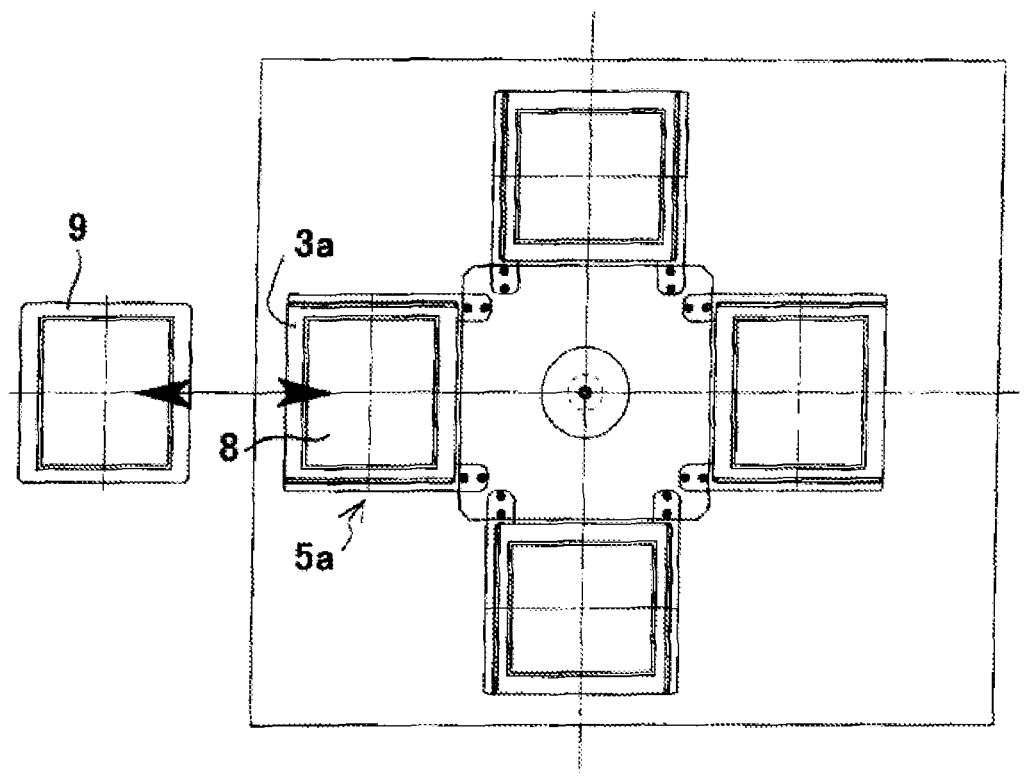
FIG. 3 is a top view of the work stage moving device, which is similar to FIG. 2(a).

Referring to FIG. 3, step 1 of the solder bump forming method is carried out when the work stage 3*a* is at the index position 5*a*. A substrate 8 to be formed with a solder bump is transferred from a supply stage 9 onto the work stage 3*a*, with a mask (not shown) disposed over an upper surface of the substrate 8. The substrate 8 may be replaced with an electronic part. The substrate or the electronic part may be supported by a support member such as a plate or a frame. Such a support member may support a plurality of substrates or electronic parts. A substrate or an electronic part alone, or together with a support member, is a "component" in the appended claims.

If the work stage 3*a* at the first index position 5*a* has thereon a substrate that has already undergone the above-described step 10, then step 11 is carried out at the first index position 5*a* prior to step 1. More specifically, the substrate which has already been formed with a solder bump is transferred from the work stage 3*a* onto the supply stage 9 and delivered to a subsequent process. Thereafter, step 1 is carried out.

Figure 4A:
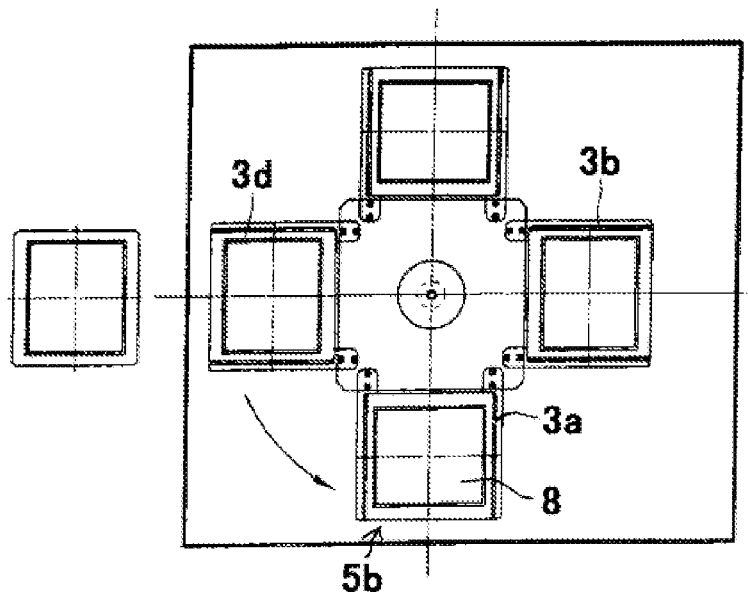
FIG. 4(*a*) is a top view of the work stage moving device as rotated through a quarter turn.
Figure 4B:
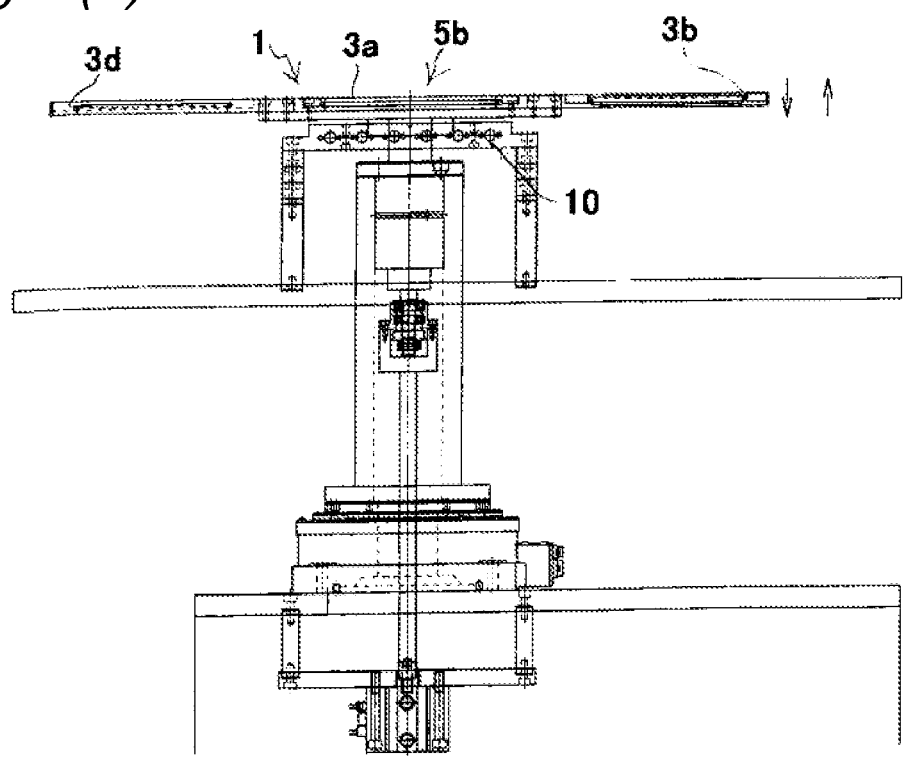

Next, on the condition that operations performed at the other index positions 5*b* to 5*d* (described later) have been completed, the work stage moving device 1 rotates through a quarter turn, thereby causing the work stages 3*a* to 3*d* to move to their respective next index positions. FIG. 4(*a*) shows the way in which the work stage 3*a* is positioned at the second index position 5*b*. FIG. 4(*b*) is a side view of the work stage moving device 1 in the position shown in FIG. 4(*a*), as seen from the second index position 5*b* side. At the second index position 5*b*, step 2 is carried out. The solder bump forming apparatus has a heater unit (first heater unit) 10 fixedly disposed at the second index position 5*b*. When the work stage 3*a* is positioned at the second index position 5*b*, the work stage moving device 1 moves vertically, causing the work stage 3*a* to be lowered, together with the other work stages 3*b* to 3*d* secured to the central support plate 2. As a result, the lower surface of the work stage 3*a* abuts against the upper surface of the fixed heater unit 10. The heater unit 10 is constantly kept at a temperature of 190° C., for example. The substrate 8 is preheated to 190° C. by the heater unit 10, for example. In a case where the substrate 8 is supported by a support member, e.g. a plate, or a frame, the contact of the heater unit 10 with the substrate 8 and heat transfer to the substrate 8 may be performed through the support member. Further, the contact of the heater unit 10 with the substrate 8 and heat transfer to the substrate 8 may be performed through a part of a member constituting the work stage.

While step 2 is being carried out at the second index position 5*b*, at the first index position 5*a*, step 11 is carried out for a substrate already formed with a solder bump, and step 1 is carried out for a new substrate. At the other index positions (third index position 5*c* and fourth index position 5*d*) also, steps associated therewith are executed (described later).

Figure 5A:
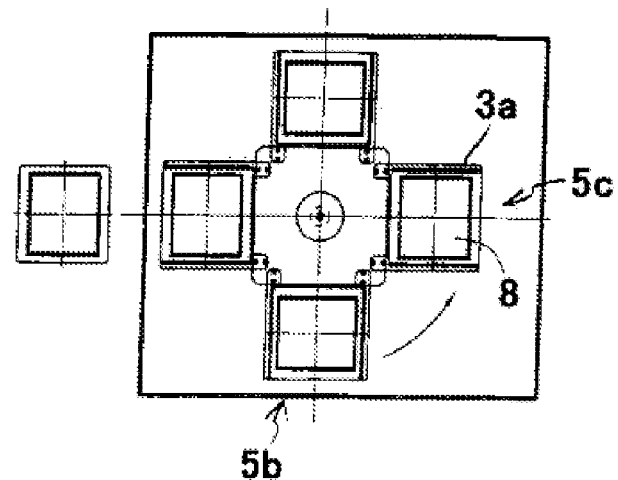
FIG. 5(*a*) is a top view of the work stage moving device as rotated through another quarter turn.
Figure 5B:
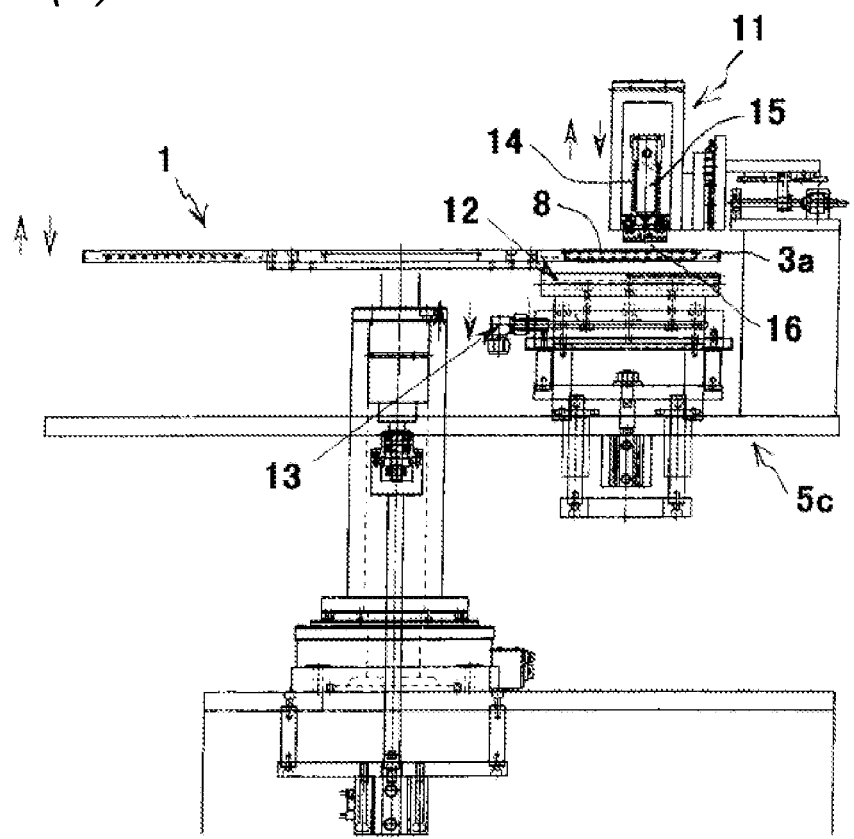

Upon completion of the preheating of the substrate 8, the work stage moving device 1 raises and rotates the work stages 3*a* to 3*d* through another quarter turn on the condition that the operations at the other index positions 5*a*, 5*c* and 5*d* have been completed. FIG. 5(*a*) shows the way in which the work stage 3*a* is positioned at the third index position 5*c*. FIG. 5(*b*) is a side view of the work stage moving device 1 in the position shown in FIG. 5(*a*), as seen from the second index position 5*b* side. At the third index position 5*c*, steps 3 to 9 are executed.

The solder bump forming apparatus has an injection head 11, a fixed heater unit (second heater unit) 12, and a cooling unit (second cooling unit) 13, which are provided at the third index position 5*c*. The injection head 11 is disposed above the work stage moving device 1 vertically movably and horizontally slidably. The injection head 11 incorporates therein a heater unit 14 (third heater unit) and can hold molten solder 15 therein. The molten solder 15 in the injection head 11 can be discharged from a nozzle 16 at the bottom of the injection head 11 by applying a pressure to the molten solder 15 in the injection head 11.

The heater unit 12 is fixedly disposed underneath the work stage moving device 1. The cooling unit 13 is disposed underneath the heater unit 12 vertically movably.

When the work stage 3*a* is positioned at the third index position 5*c*, the work stage moving device 1 moves vertically, causing the work stage 3*a* to lower, together with the other work stages. As a result, the lower surface of the substrate 8 abuts against the upper surface of the fixed heater unit 12. Next, the injection head 11 moves down to abut against the mask disposed over the substrate 8 (step 3).

The already preheated substrate 8 is further heated by the fixed heater unit 12 (step 4). The fixed heater unit 12 may be configured to keep a temperature of 230° C. at all times. The substrate 8 is heated by the fixed heater unit 12 to the working temperature thereof, e.g. 230° C.

Meanwhile, the solder 15 in the injection head 11 is also heated by the internal heater unit 14 to the working temperature thereof, e.g. 230° C. (step 5). The molten solder in the injection head 11 may be heated to a temperature around 190° C. in advance.

After both the substrate 8 and the molten solder 15 have been heated to a set heating temperature (e.g. 230° C.), the injection head 11 starts to slide horizontally over the mask disposed over the substrate 8, and, at the same time, the pressure of an inert gas (e.g. nitrogen gas) is applied to the molten solder 15 in the injection head 11. The molten solder 15 having the pressure applied thereto is discharged from the nozzle 16. The nozzle may be a slit nozzle formed in a pliable elastic material, e.g. silicone rubber.

The injection head 11, while sliding horizontally over the mask, allows the discharged molten solder to flow into the opening provided in the mask. At the same time, the sliding injection head 11 scrapes off surplus molten solder discharged on the upper surface of the mask. By these actions, molten solder is filled into the opening in the mask (step 6). The opening in the mask is provided at a position corresponding to "a position on the substrate 8 where a solder bump is to be formed"; therefore, the molten solder filled in the opening in the mask is "a predetermined amount of molten solder for solder bump formation supplied onto the substrate 8".

Upon completion of the supply of molten solder onto the substrate 8, the application of the pressure to the molten solder 15 in the injection head 11 is stopped, and the sliding movement of the injection head 11 is stopped. Then, the operations of the fixed heater unit 12 having heated the substrate 8 and the heater unit 14 in the injection head 11 are stopped (step 7).

Next, the cooling unit 13 is raised to make the upper surface of the cooling unit 13 abut against the lower surface of the fixed heater unit 12, whose operation has already been stopped (step 8). The main purpose of this step 8 is to forcedly cool the injection head 11 and, consequently, the molten solder 15 in the injection head 11 down to such a temperature that molten solder does not drool from the nozzle 16 even when the injection head 11 is raised to separate from the mask. When the above-described slit nozzle is used, there is no possibility of the molten solder in the injection head 11 drooling once the temperature thereof becomes not higher than 190° C. The cooling unit 13 may be configured to keep a predetermined standby temperature beforehand.

The forced cooling of the injection head 11 at step 8 is performed through the fixed heater unit 12, whose operation has been stopped. There is another conceivable technique in which the heater unit 12 is shifted horizontally to allow the cooling unit 13 to abut against the substrate 8. However, it has been proved that the cooling by heat transfer through the fixed heater unit 12, whose operation has been stopped, is more rational in view of the fact that the operating time at the other index positions, particularly the operating time required for step 1 and step 11 (loading and unloading of a substrate) at the first index position 5a, exceeds the overall working time at the third index position 5c, and the fact that an additional cost is imposed if a mechanism for horizontally shifting the heater unit 12 is added.

In addition, because the cooling of the injection head 11 at step 8 is performed through both the substrate 8 and the mask, the molten solder supplied onto the substrate 8 is also cooled at the same time. Therefore, there is no possibility that the solder on the substrate 8 form an unfavorable bridge in a molten state when the injection head 11 is raised to separate from the mask (step 9) after the temperature of the molten solder 15 in the injection head 11 has lowered to a temperature at which the molten solder 15 does not drool from the nozzle 16.

As the injection head 11 moves up, the cooling unit 13 moves down. After the cooling unit 13 has moved down to separate from the fixed heater unit 12, the fixed heater unit 12 is reactivated to heat up to a standby temperature. The heater unit 14 in the injection head 11 is also reactivated to heat the solder in the injection head 11 to a standby temperature. The injection head 11 may be moved to its home position to stand by.

After the injection head 11 has moved up, the work stage moving device 1 raises and rotates the work stages 3a to 3d through still another quarter turn on the condition that the operations at the other index positions 5a, 5b and 5d have been completed.

Figure 6A:
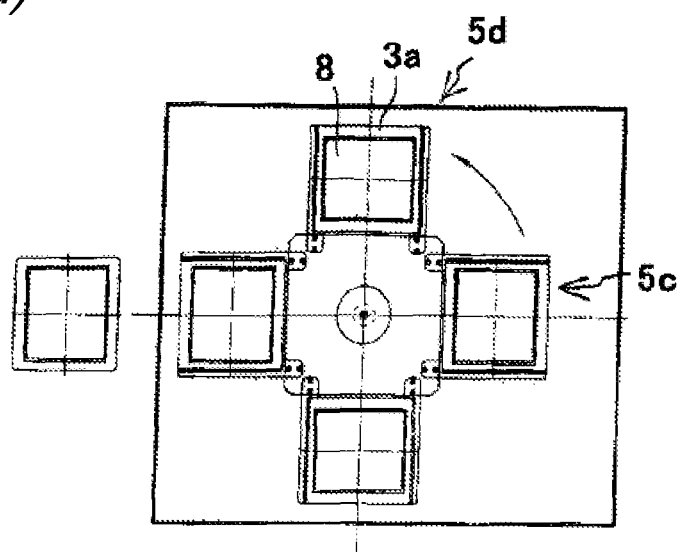
FIG. 6(*a*) is a top view of the work stage moving device as rotated through still another quarter turn.
Figure 6B:
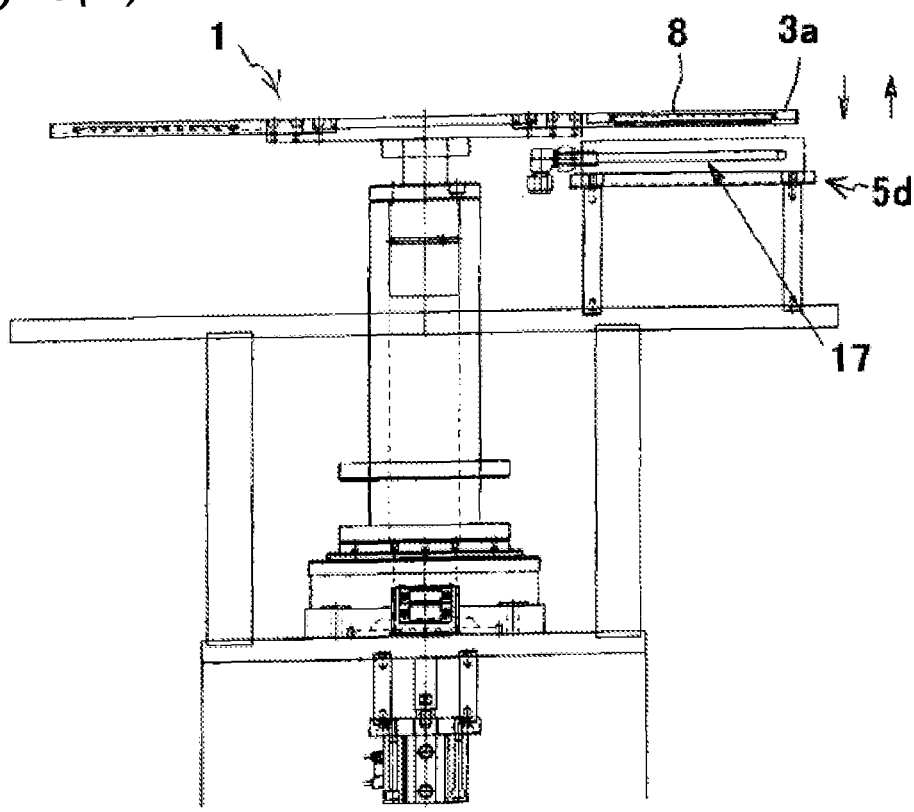

FIG. 6(a) shows the way in which the work stage 3a is positioned at the fourth index position 5d. FIG. 6(b) is a side view of the work stage moving device 1 in the position shown in FIG. 6(a) as seen from the third index position 5c side. The solder bump forming apparatus has a cooling unit (second cooling unit) 17 fixedly disposed at the fourth index position 5d. The cooling unit 17 is located underneath the work stage 3a positioned at the fourth index position 5d. The work stage 3a is moved down, together with the other work stages, resulting in the lower surface of the substrate 8 abutting against the upper surface of the fixed cooling unit 17. The molten solder supplied onto the substrate 8 by step 6 at the third index position 5c is completely cooled and solidified by the cooling unit 17 to form a solder bump on the substrate 8 (step 10). It may be judged that the molten solder supplied onto the substrate 8 has been completely cooled when the substrate 8 cools down to 50° C., for example.

Upon completion of step 10, the work stage moving device 1 raises and rotates the work stages 3a to 3d through a further quarter turn on the condition that the operations at the other index positions 5a, 5b and 5c have been completed. In this way, the work stage 3a returns back to the first index position 5a. At the first index position 5a, the substrate 8 having already been formed with a solder bump is unloaded from the work stage 3a onto the supply stage 9 (step 11), as has been stated above. After the substrate 8 has been delivered from the supply stage 9 to the subsequent process, step 1 is executed, as has been stated above.

As will be clear, the operating cycle of the work stage moving device 1 for cyclically rotating the work stages 3a to 3d through a quarter turn is determined by the longest of the times required for the operations performed at all the index positions. At an index position where the operation has already been completed, the work stage is placed in a standby state if the operation at any other index position has not yet been completed.

The one embodiment of the solder bump forming apparatus disclosed in the specification and drawings of this application includes the injection head 11, the heater units 10, 12 and 14, and the cooling units 13 and 17 in addition to the work stage moving device 1.

REFERENCE SIGNS LIST

1: work stage moving device, 2: central support plate, 3a-3d: work stage, 4: shaft, 5a-5d: index position, 6: base, 7: post member, 8: substrate, 9: supply stage, 10: first heater unit, 11: injection head, 12: second heater unit, 13: first cooling unit, 14: third heater unit, 15: molten solder, 16: nozzle, 17: second cooling unit.

The invention claimed is:

1. A solder bump forming apparatus comprising:
   a work stage arranged to carry an electronic component having a mask disposed over an upper surface of the electronic component with a mask opening positioned where the bump is to be formed directly on the electronic component;
   a first heater unit positioned to be in direct or indirect heating contact with a lower surface of the electronic component when the work stage is in a mask opening filling index position and the electronic component is supported by the work stage;
   a molten solder injection head movably supported at the mask opening filling position to move horizontally while maintaining a nozzle of the injection head in contact with an upper surface of the mask and the molten solder injection head being arranged to supply molten solder through the nozzle to deliver a predetermined amount of molten solder directly onto the electronic component at the mask opening when the work stage is in the mask opening filling index position and the electronic component is supported by the work stage; and
   a first cooling unit movably supported at the mask opening filling position to move between a non-contacting position and a contacting position in which the first cooling unit selectively contacts a lower surface of the first heater unit, wherein the first cooling unit is arranged to forcedly cool, through the first heater unit, each of (1) the electronic component supplied with the molten solder, (2) the mask, (3) the molten solder in the mask opening, and (4) the nozzle holding molten solder when the first cooling unit contacts the lower surface of the first heater unit after the operation of the first heater unit has been stopped.

2. The solder bump forming apparatus of claim 1, further comprising a second heater unit positioned at a preheating index position to be in direct or indirect contact with the lower surface of the electronic component when the work stage is in the preheating index position and the electronic component is supported by the work stage; and
   a second cooling unit positioned at a post-filling index position to be in direct or indirect contact with the lower surface of the electronic component when the work stage is in the post-filling index position and the electronic component is supported by the work stage.

3. The solder bump forming apparatus of claim 2, further comprising a work stage moving device, wherein
   the work stage includes first to fourth work stages supported by the work stage moving device, the first to fourth work stages being spaced from each other at an angle of 90 degrees around an axis of rotation of the work stage moving device, and
   the work stage moving device is arranged to intermittently rotate the first to fourth work stages so that the first to fourth work stages take fixed first to fourth index positions, respectively, in sequential rotation, wherein the fixed first to fourth index positions correspond to a work stage loading index position, the preheating index position, the mask opening filling position, and the post-filling index position, respectively.

4. The solder bump forming apparatus of claim 3, further comprising a supply stage for loading and unloading the component between the supply stage and the work stage positioned at the work stage loading index position.

* * * * *